United States Patent
Chuan

(10) Patent No.: US 6,919,759 B2
(45) Date of Patent: Jul. 19, 2005

(54) DIGITALLY CONTROLLED TUNER CIRCUIT

(75) Inventor: Chia-So Chuan, Chang Hua Hsien (TW)

(73) Assignee: Winbond Electronics Corporation, Hsinchu (TW)

( * ) Notice: Subject to any disclaimer, the term of this patent is extended or adjusted under 35 U.S.C. 154(b) by 45 days.

(21) Appl. No.: 10/740,331

(22) Filed: Dec. 18, 2003

(65) Prior Publication Data

US 2005/0024151 A1 Feb. 3, 2005

(30) Foreign Application Priority Data

Aug. 1, 2003 (TW) ........................................ 92121219 A

(51) Int. Cl.[7] .................................................. H03K 5/00
(52) U.S. Cl. ........................................ 327/552; 331/17
(58) Field of Search ................................ 327/552–559; 331/1 A, DIG. 2, 17, 16

(56) References Cited

U.S. PATENT DOCUMENTS

| | | | | |
|---|---|---|---|---|
| 4,812,773 A | * | 3/1989 | Yamamoto et al. | 327/553 |
| 5,281,931 A | * | 1/1994 | Bailey et al. | 333/17.1 |
| 5,914,633 A | * | 6/1999 | Comino et al. | 327/553 |
| 6,052,034 A | * | 4/2000 | Wang et al. | 331/2 |
| 6,262,624 B1 | * | 7/2001 | Tsinker | 327/553 |
| 6,657,483 B1 | * | 12/2003 | Sahu | 327/553 |

* cited by examiner

*Primary Examiner*—Dinh T. Le
(74) *Attorney, Agent, or Firm*—Thomas, Kayden, Horstemeyer & Risley

(57) ABSTRACT

A digitally controlled tuner circuit for continuous time filters. The digital PLL-based tuner circuit has a digitally controlled oscillator and an open-loop filter. The oscillator has digitally adjusted resistors to allow for digital fine tuning of its time constant and its output frequency. A lock detector detecting the output of the open-loop filter is also part of the tuner circuit.

13 Claims, 8 Drawing Sheets

DIGITALLY CONTROLLED TUNER CIRCUIT

BACKGROUND OF THE INVENTION

1. Field of Invention

The present invention relates to integrated circuits. More particularly, the present invention relates to a digitally controlled tuner circuit for continuous-time filters.

2. Description of Related Art

To implement a continuous-time filter, various techniques and architecture have been developed. Widely used approaches employ transconductance-capacitor (gm-C) technique, active resistor-capacitor (active RC) type architecture, or MOSFET-capacitor (MOSFET-C) architecture.

When the process variation and temperature drift cause variations of active and passive devices, including the resistor and capacitor, the cutoff frequency of a continuous-time filter may drift and be unstable. For example, 3-dB bandwidth may have huge drift due to the drift of the cutoff frequency. Besides, variations of the resistance and/or capacitance also result in the variation of RC time constant. These facts described above all cause a continuous-time filter to be in an unstable condition.

FIG. 1 illustrates architecture of a traditional analog phase-locked loop (PLL) for tuning a continuous-time filter. The PLL in FIG. 1 consists of a phase/frequency detector (PFD) 100, a voltage-controlled oscillator (VCO) 110, a charge pump circuit 120, and a closed-loop filter 130. An input reference signal 102 is supplied to the PFD 100. The PFD 100 produces two outputs that indicate the frequency or phase difference between the reference signal 102 and the output signal of the VCO 110. The outputs of the PFD 100 are supplied to the charge pump circuit 120 and the closed-loop filter 130 generates a corresponding DC control voltage 140. The control voltage 140 is used to tune and control a continuous-time filter (not shown in FIG. 1). In addition, the control voltage 140 is also used to control the frequency of the output signal of the VCO 110. During the operation of the PLL in FIG. 1, PFD 100 and the charge pump circuit 120 function and adjust the control voltage 140, so that the frequency of the output signal of the VCO 110 tracks and approaches the frequency of the reference signal 102. When the frequencies of the two signals are close enough, the PFD 100 starts to perform phase lock.

However, the shortcomings of the above PLL include the following. When the control voltage 140 varies with process and temperature variations, the bandwidth of the continuous-time filter tuned by the control voltage 140 also varies and is unstable. Although the drift of bandwidth can be alleviated to a certain extent if the closed-loop filter 130 has a large RC time constant, the price for a large time constant is that the closed-loop filter 130 will occupy a huge hardware or require external components. Besides, the quality of the DC control voltage 140 is dependent on the phase noise and jitter performance of the PLL.

SUMMARY OF THE INVENTION

An objective of the present invention is to provide a PLL-based, digitally-controlled tuner circuit architecture for tuning a continuous-time filter so as to provide a continuous-time filter with improved performance in which the problem of devices variations due to the process and temperature variations is overcome.

According to a first embodiment of the invention, a digitally-controlled tuner circuit includes a digitally-controlled oscillator, a square-wave generator, a phase/frequency detector, an up/down counter, a first decoder, and a digital filter. The digitally-controlled oscillator receives a digital control signal and produces an output periodic signal in response to the digital control signal. The digital control signal is composed of a plurality of bits. The square-wave generator is coupled to the digitally-controlled oscillator, and receives the output periodic signal and then converts the same into a square wave output periodic signal. The phase/frequency detector is coupled to the square-wave generator, and receives a reference signal and the square wave output periodic signal. The phase/frequency detector generates an "up" signal and a "down" signal in response to the reference signal and the square wave output periodic signal.

The up/down counter is coupled to the phase/frequency detector, and produces a binary data in response to the "up" signal and "down" signal. The first decoder is coupled to the up/down counter and the digitally-controlled oscillator. The first decoder receives the binary data and produces the digital control signal in response to the binary data. The digital filter is coupled to the up/down counter, and receives the binary data to produce and output a first control signal. The first control signal is for tuning a continuous-time filter. In this embodiment, the digitally-controlled oscillator is of a transconductance-capacitor type.

The present invention also provides a plurality of digitally-controlled switch units, for example each consisting of two series MOSFETs acting as resistors, as a control interface for the digitally-controlled oscillator. In the first embodiment, an amount of resistance inside the digitally-controlled oscillator can be digitally varied through using the plurality of digitally-controlled switch units, so as to control the frequency of the output periodic signal of the digitally-controlled oscillator and allow users to compensate for the variations of a RC time constant of the digitally-controlled oscillator.

According to a second embodiment of the invention, a digitally-controlled tuner circuit includes all components of the tuner circuit in the first embodiment, and further includes a lock detector, a second decoder, and a first D flip-flop. The lock detector is coupled to the digital filter, and receives the first control signal and produces a lock-determining signal in response to the first control signal. The second decoder is coupled to the digital filter, and receives the first control signal and produces a second control signal in response to the first control signal. The first D flip-flop is coupled to the second decoder and the lock detector. The first D flip-flop receives the second control signal and the lock-determining signal, and produces a third control signal in response to the second control signal and the lock-determining signal. The third control signal is for tuning a continuous-time filter.

When a long digital state of the data of the first control signal has lasted for a period of time, the lock detector will trigger the first D flip-flop, enabling the data of the long state, after being decoded by the second decoder, to pass through the first D flip-flop to form the data of the third control signal.

In the second embodiment of the invention, implementation and architecture of the lock detector are described as follows. The lock detector includes an exclusive OR gate, a second D flip-flop, and a plurality of D flip-flops. The exclusive OR gate has a first input terminal to receive a least significant bit of the first control signal produced by the digital filter, a second input terminal and an output terminal.

The second D flip-flop has a third input terminal to receive the least significant bit, a fourth input terminal to receive a clock signal, and an output terminal coupled to the second input terminal of the exclusive OR gate. The plurality of D flip-flops include number 1 to number M D flip-flop. Each of the plurality of D flip-flops has a fifth input terminal to receive a reset signal produced at the output terminal of the exclusive OR gate, and a sixth input terminal to receive the clock signal. The number 1 D flip-flop has an input terminal to receive a triggering voltage, and the number m D flip-flop has an input terminal coupled to an output terminal of the number m−1 D flip-flop. The integer variable m is from 2 to M. The number M D flip-flop produces and outputs the lock-determining signal.

If a digital state of the least significant bit received by the exclusive OR gate remains the same in M+1 clock periods of the clock signal, during the number M+1 clock period the triggering voltage becomes an output of the number M D flip-flop for triggering the first D flip-flop of the tuner circuit in the second embodiment.

An idea of the invention is that getting the right value of the DC control voltage at the output terminal of the tuner circuit used to tune a continuous-time filter doesn't necessarily require a PLL with good phase noise and jitter performance. The digitally controlled tuner circuit of the invention is based on a digital PLL and employs an open-loop digital filter. Although a closed-loop filter is not used and thereby the jitter performance is lowered, after the digital PLL is locked the right DC control voltage value can be obtained when using an open-loop digital filter.

Since the digitally controlled tuner circuit of the invention doesn't incorporate a closed-loop digital filter, there is no problem of the RC time constant being very large. The RC time constant of the open-loop digital filter is not large and thereby the open-loop digital filter doesn't occupy a huge amount of hardware. In addition, the tuner circuit of the invention is completely digital, so the tuner circuit has the advantage of low harmonic distortion and low noise.

It is to be understood that both the foregoing general description and the following detailed description are examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

First Embodiment

Figure 1:
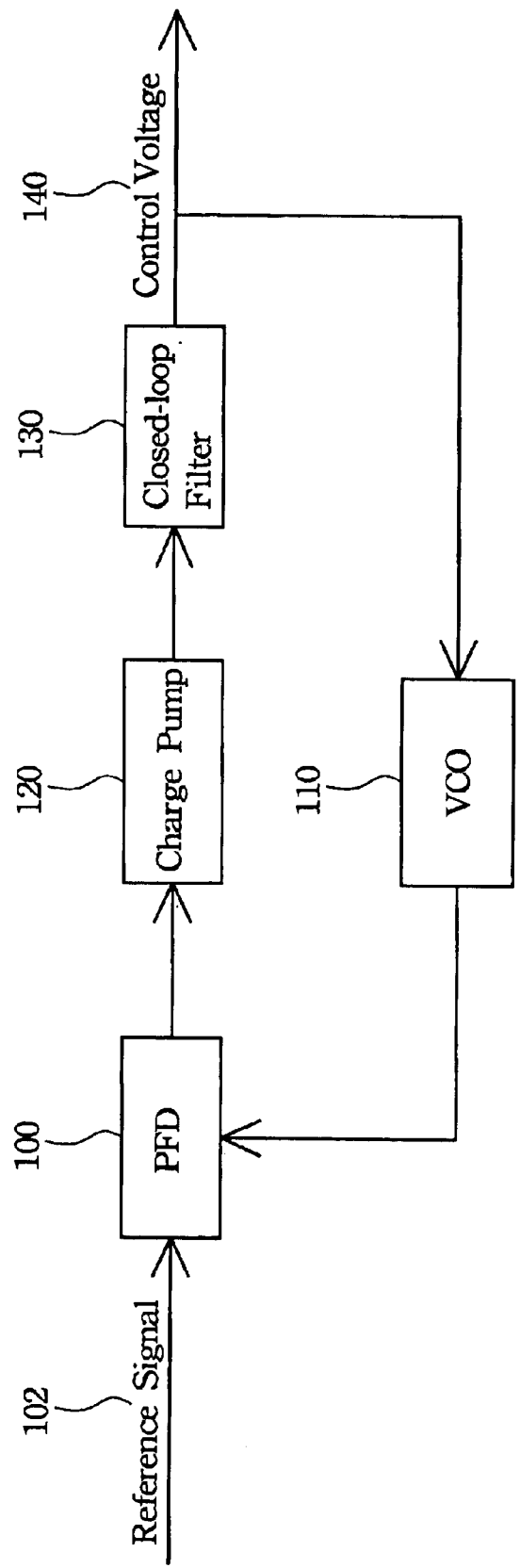
FIG. 1 illustrates architecture of a traditional analog phase-locked loop for tuning a continuous-time filter.
Figure 2:
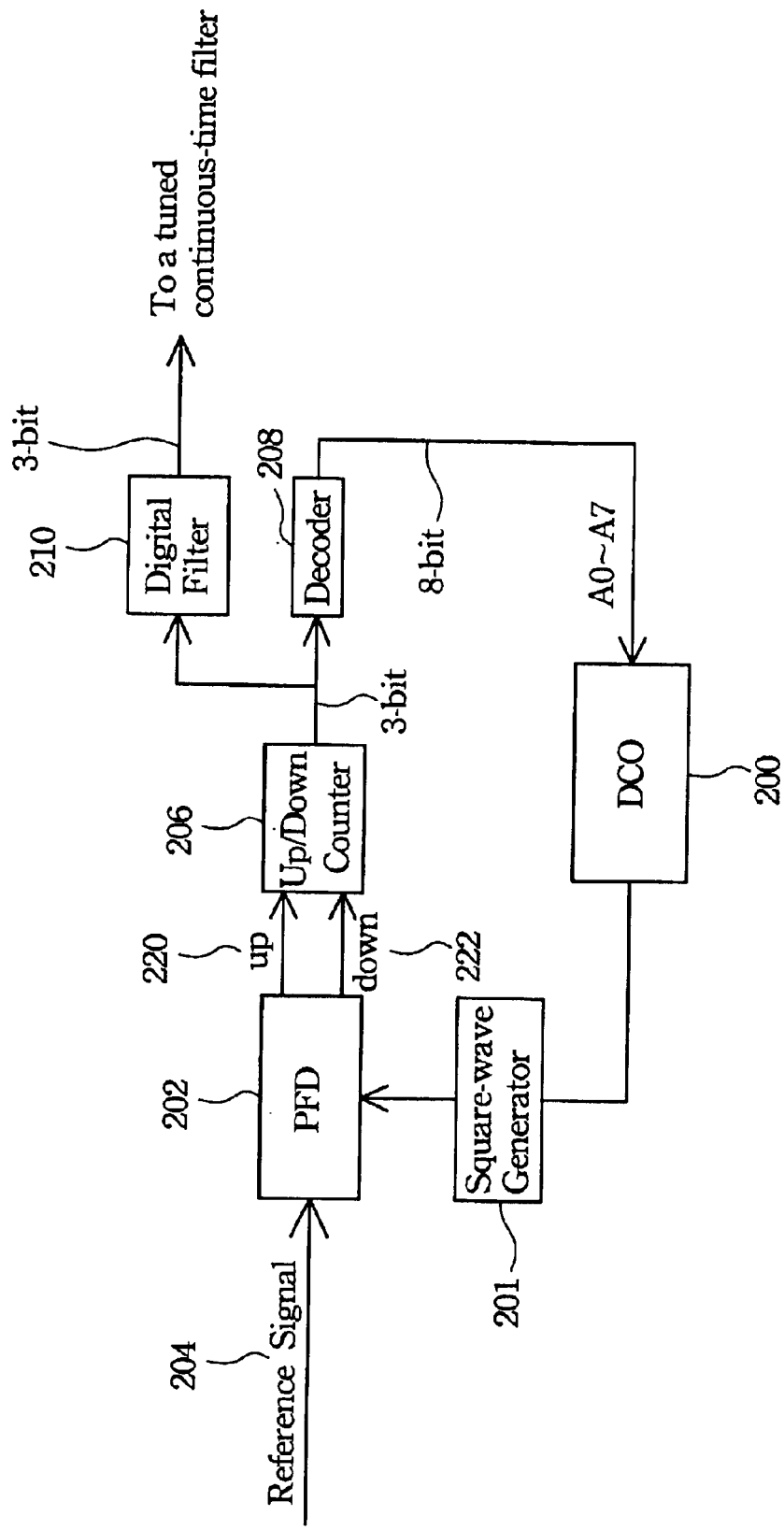
FIG. 2 illustrates the architecture of a digitally controlled tuner circuit according to an embodiment of the invention.

FIG. 2 illustrates the architecture of a digitally controlled tuner circuit according to an embodiment of the invention. The digitally controlled tuner circuit is based on a digital PLL and includes a digitally-controlled oscillator (DCO) 200, a square-wave generator 201, a phase/frequency detector 202, an up/down counter 206, a decoder 208, and a digital filter 210. A DCO is a digitized voltage-controlled oscillator. In this digital PLL, the digital filter 210 is an open-loop filter. The term "open-loop" implies that the digital PLL is "opened" by the digital filter 210.

The phase/frequency detector 202, for example a linear multiplier, receives an input reference signal 204 with a reference frequency and an output periodic signal of the DCO 200. Since the output periodic signal of the DCO 200 is usually a sinusoidal signal and the input reference signal 204 is usually a square-wave, the output periodic signal of the DCO 200 needs to be transformed through a square-wave generator 201, for example a comparator, into a square-wave output periodic signal, before entering the phase/frequency detector 202.

The phase/frequency detector 202 generates two outputs in response to the reference signal 204 and the square-wave output periodic signal. The two outputs include an "up" signal 220 and a "down" signal 222, and the phase/frequency detector 202 transmits the two outputs to the up/down counter 206. The difference between the "up" signal 220 and the "down" signal 222 indicates and is proportional to the frequency difference or phase difference between the reference signal 204 and the square-wave output periodic signal. In this embodiment, the output of the up/down counter 206 is, for example, 3 bits that pass through the decoder 208 responsible for interfacing to generate an 8-bit (A0–A7) digital control signal. The digital control signal further controls the frequency of the output periodic signal of the DCO 200. According to the principles of a PLL, the frequency of the output periodic signal of the DCO 200 keeps tracking the frequency of the reference signal 204. In addition, the output of the up/down counter 206 is supplied to the digital filter 210. The output of the digital filter 210 is the output of the digitally controlled tuner circuit, and is used to tune a continuous-time filter.

The continuous 3-bit output of the up/down counter 206 is binary coded data, and each of the data is quantized as a digital state. If L different states are assumed, the continuous binary coded data can be regarded as a L-ary digital signal or a digitized sine wave.

Figure 3:
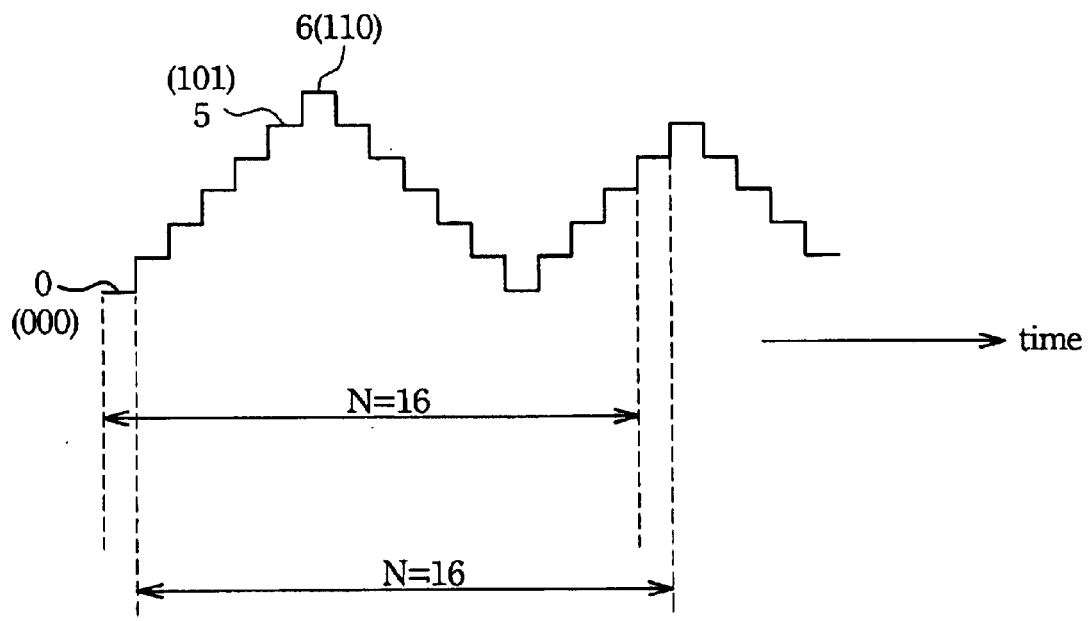
FIG. 3 illustrates a continuous result of the output of the up/down counter in FIG. 2 during a period of time.

FIG. 3 illustrates a continuous result of the output of the up/down counter 206 during a period of time. As shown in FIG. 3, the binary data 000 corresponds to a state with a decimal integer value 0, the binary data 101 to a state with an integer value 5, and the binary data 110 to a state with an integer value 6. Since all data of the output has 3 bits, there are 8 different states.

Figure 4:
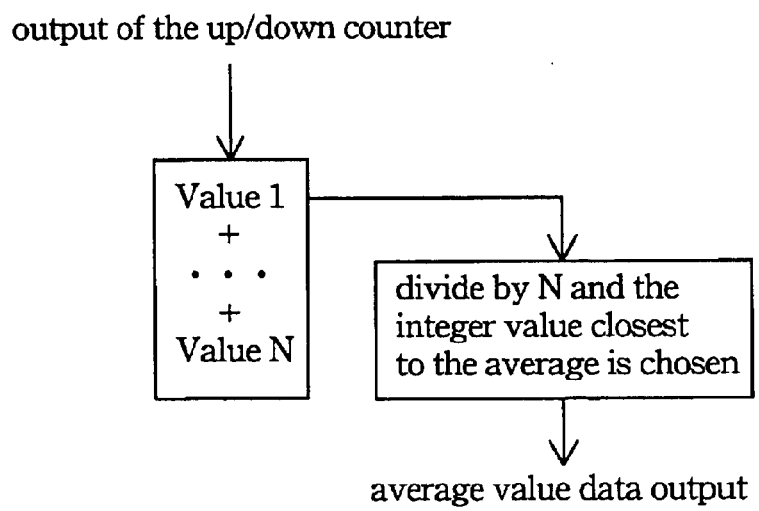
FIG. 4 illustrates the operation fashion of the digital filter in FIG. 2.

FIG. 4 illustrates the operation fashion of the digital filter 210. With reference to FIG. 4, the digital filter 210 receives the continuous output binary data from the up/down counter 206, stores a number N of the binary data continuously, and continuously calculates the average value of the integer values of the N binary data using, for example, a divider. The 3-bit binary data with an integer value closest to the calculated average value is designated as the average value data output by the digital filter 210. The average value data corresponds to the desired DC control voltage. For example, suppose N is equal to 16 as shown in FIG. 3. The continuous calculation of the average value of the N binary data by the digital filter 210 first calculates the average of the first to sixteenth data, then calculates that of the second to seventeenth data, and then calculates that of the third to eighteenth data. Subsequent calculations are performed in the same way. The calculation process continues with time, and average value data are generated continuously. The output of the digital filter 210 is for tuning a continuous-time filter.

Figure 5:
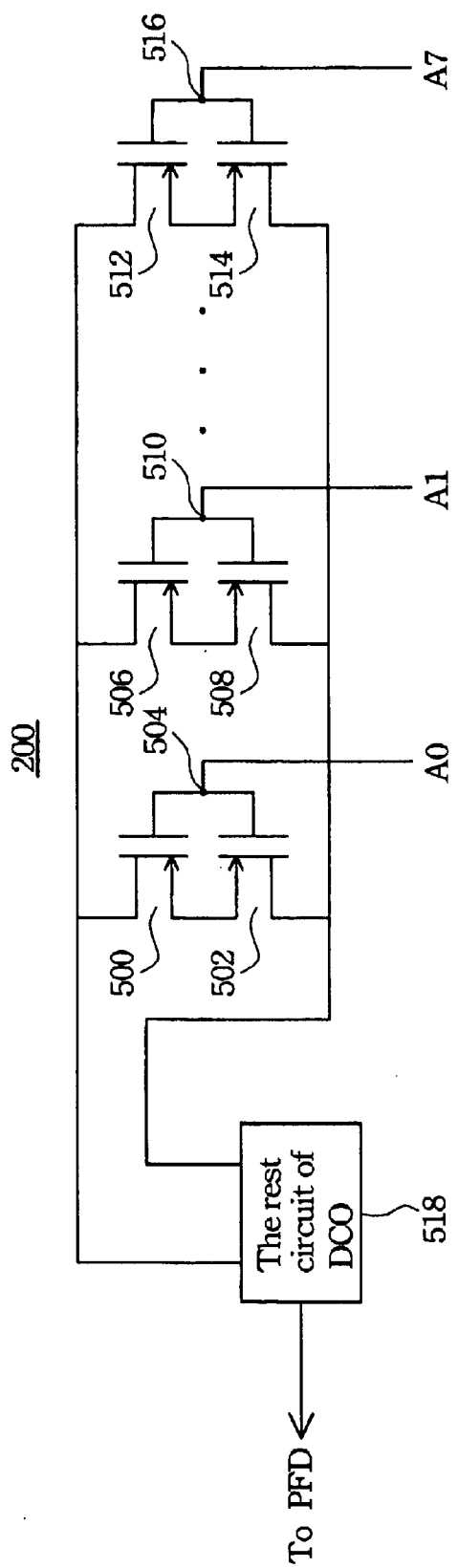
FIG. 5 illustrates an implementation of the DCO in FIG. 2.

In this embodiment, the DCO 200 is a transconductance-capacitor type oscillator. FIG. 5 illustrates an implementation of the DCO 200. The 8-bit data A0–A7 of the digital control signal described above generated at the output of the decoder 208 control the frequency of the output periodic signal of the DCO 200 through 8 switch units, as shown in FIG. 5. The switch units employ, for example, metal-oxide-semiconductor field-effect transistors (MOSFETs) acting as linear resistors.

Each switch unit is composed of a pair of MOSFETs connected in series. The pair of MOSFETs is both P-type MOSFETs or both N-type MOSFETs. In this implementation, they are P-type MOSFETs with their source terminals connected. The first switch unit contains MOSFETs 500 and 502 with their gate terminals connected to form an input terminal 504 of the first switch unit. The input terminal 504 is used to receive the bit A0 of the digital control signal. The second switch unit contains MOSFETs 506 and 508 with their gate terminals connected to form an input terminal 510 of the second switch unit used to receive the bit A1 of the digital control signal. Other switch units are composed in a similar way, and the eighth switch unit contains MOSFETs 512 and 514 with an input terminal 516 used to receive the bit A7 of the digital control signal. As shown in FIG. 5, each of the switch units is in parallel with a resistance R (not shown in FIG. 5) inside the rest circuit 518 of the DCO 200.

When a 3-bit binary data at the output of the up/down counter 206 in FIG. 2 is 000, after the data is decoded by the decoder 208, the bit A0 is enabled to turn on the first switch unit and the MOSFETs 500 and 502 enter deep triode region of operation so that they essentially act as linear resistors. The resistance of each linear resistor can be controlled by the ratio of the channel width to the channel length (W/L) of the corresponding MOSFET. The sum of the resistances of the MOSFETs 500 and 502 is in parallel with the resistance R so as to constitute a total resistance used to control the frequency of the output periodic signal of the DCO 200. When a 3-bit binary data at the output of the up/down counter 206 is 001, after the data is decoded, the bit A1 is enabled to turn on the second switch unit and the MOSFETs 506 and 508 essentially act as linear resistors. Other switch units function in the same way and every 3-bit data after being decoded can turn on only one of the 8 switch units, the other switch units being off.

Enabling one of the 8 different bits (A0–A7) of the digital control signal allows digitally adjusting and controlling the total resistance described above. Digitally adjusting and controlling the total resistance can adjust the frequency of the output periodic signal of the DCO 200 and allows users to compensate for the variations of a RC time constant of the DCO 200.

Because of the residual effect of the divider inside the digital filter 210, when the PLL of the tuner circuit of FIG. 2 is locked, all average value data continuously output by the digital filter 210 may not be the same particular 3-bit data, but their occurrences may be limited to two different 3-bit data with consecutive integer values or digital states. For example, when the PLL is locked, the digital states of a series of average value data continuously output by the digital filter 210 in a period of time may be 3, 3, 3, 3, 2, 3, 3, 3, 3, 3, 2, and 3. Between the two different digital states, one digital state (3) appears longer than the other state (2) in the period of time. The shorter state is due to the residual effect, so it should be. The longer state certainly represents the desired DC control voltage. A second embodiment for avoiding the shorter state is provided in the following.

Second Embodiment

Figure 6:
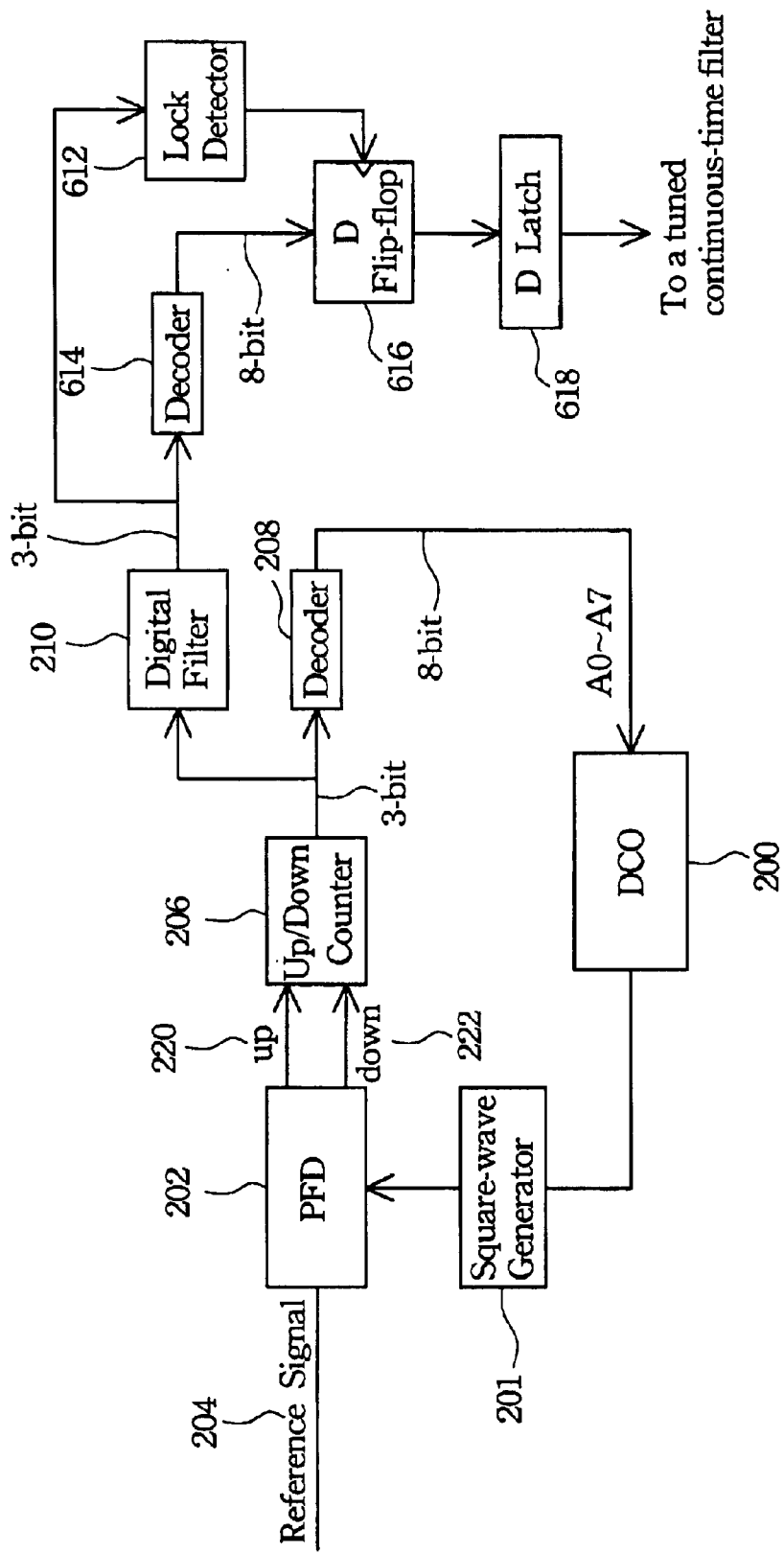
FIG. 6 illustrates the architecture of a digitally controlled tuner circuit according to another embodiment of the invention.

FIG. 6 illustrates the architecture of a digitally controlled tuner circuit according to a second embodiment of the invention. This tuner circuit is for tuning and controlling a continuous-time filter. The tuner circuit in the second embodiment includes all components in the first embodiment, and further includes a decoder 614, a lock detector 612, a D flip-flop 616, and a D latch 618.

The decoder 614 decodes all 3-bit data output by the digital filter 210 to generate 8-bit data. The lock detector 612 receives the 3-bit data output by the digital filter 210 and detects the long state. When a long state is detected, the lock detector 612 triggers the D flip-flop 616, then the 8-bit data output by the decoder 614 and stored by the D flip-flop 616 is sent by the D flip-flop 616 to the D latch 618. Afterwards, when the continuous-time filter needs the desired control voltage, represented by the 8-bit data stored by the D latch 618, the D latch 618 is triggered and then outputs the 8-bit data to tune the continuous-time filter.

Figure 7:
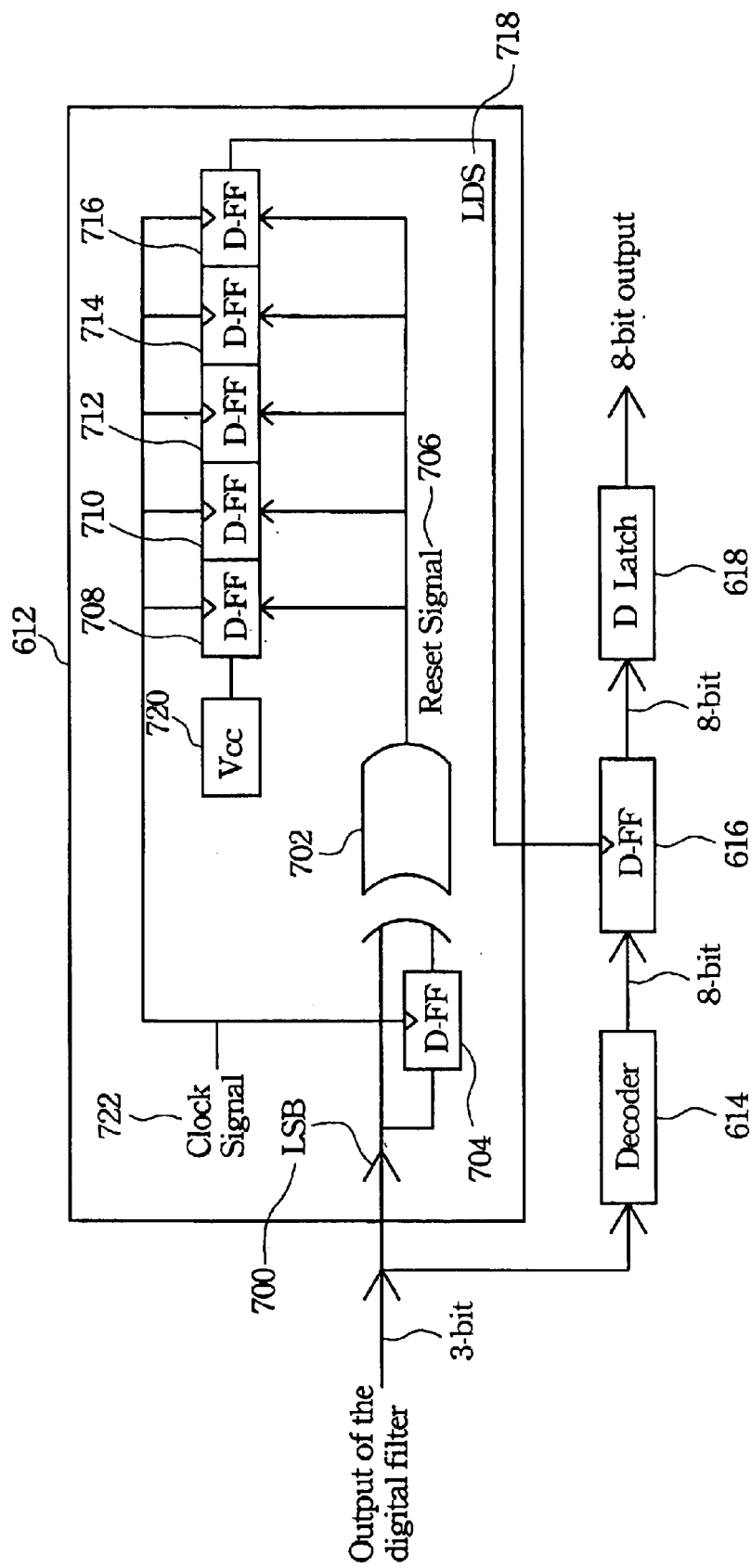
FIG. 7 illustrates an implementation of the lock detector in FIG. 6.

Because the two different possible 3-bit data (such as 010 and 011) output by the digital filter 210 have two consecutive integer values or digital states (2 for 010 and 3 for 011), the least significant bits of the two data must be different, so the long state can be detected by observing the least significant bit of the 3-bit data. FIG. 7 illustrates an implementation of the lock detector 612 in FIG. 6. Assume a long state is a state that lasts for at least 6 clock periods, then in this embodiment the lock detector 612 includes an exclusive OR gate (XOR) 702, a D flip-flop 704, and 5 D flip-flops 708, 710, 712, 714, and 716 shown in FIG. 7. D flip-flops are represented by the symbol D-FF in FIG. 7.

With reference to FIG. 7, the exclusive OR gate 702 has an input terminal to receive the least significant bit (abbreviated as LSB in FIG. 7) 700 of the 3-bit output data of the digital filter 210. The D flip-flop 704 has an input terminal to receive the least significant bit 700, another input terminal to receive a clock signal 722, and an output terminal connecting to another input terminal of the exclusive OR gate 702. Each of the 5 D flip-flops 708, 710, 712, 714, and 716 has an input terminal to receive a reset signal 706 generated at an output terminal of the exclusive OR gate 702, and has another input terminal to receive the clock signal 722. The D flip-flop 708 has an input terminal to receive a triggering voltage Vcc 720 with a high binary state of 1. Each D flip-flop 710, 712, 714, and 716 has an input terminal coupled to an output terminal of the D flip-flops 708, 710, 712, and 714 respectively. The output of the D flip-flop 716 is a lock-determining signal (abbreviated as LDS in FIG. 7) that provides an output of the lock detector 612.

The operation of the lock detector 612 is described as follows. The D flip-flops 704, 708, 710, 712, 714, and 716 save states and each has an effect of delaying a state. Suppose the two different 3-bit data output by the digital filter 210 are 011 and 010. It can be assumed that before a first clock period the 3-bit data 010 is output by the digital filter 210, so its least significant bit 0 enters an input terminal of the exclusive OR gate 702 and also enters the D flip-flop 704. It can also assumed that in the first clock period the 3-bit data 011 is output by the digital filter 210, so its least significant bit 1 enters the same input terminal of the exclusive OR gate 702. In the first clock period the D flip-flop 704 outputs the least significant bit 0 of the 3-bit data 010 to the other input terminal of the exclusive OR gate 702, so the two inputs to the exclusive OR gate 702 are opposite, and therefore the state of an output reset signal 706 of the exclusive OR gate 702 becomes 1 and thereby resets the D flip-flops 708, 710, 712, 714, and 716. To reset a D flip-flop means to set the output of the D flip-flop to a state 0. Also, in the first clock period the triggering voltage Vcc 720 enters and is stored by the D flip-flop 708.

Just after the first clock period ends and the clock changes, the least significant bit 1 of the 3-bit data 011 is output by the D flip-flop 704 and enters the exclusive OR gate 702. If the 3-bit data during the second clock period is still the 3-bit data 011, its least significant bit 1 enters the exclusive OR gate 702 and the two inputs to the exclusive OR gate 702 are both 1, so the state of the reset signal 706 becomes 0 and thereby doesn't reset the D flip-flops 708, 710, 712, 714, and 716. Since the D flip-flop 708 isn't reset, the triggering voltage Vcc 720 is output by the D flip-flop 708, so the output of the D flip-flop 708 during the second clock period is a state 1. Furthermore, if the 3-bit data during the third clock period is still the 3-bit data 011, the state of the reset signal 706 is still 0 and doesn't reset the D flip-flops 708, 710, 712, 714, and 716. Therefore, the triggering voltage Vcc 720 is output by the D flip-flop 710.

Along the same lines, if the 3-bit data during the fourth, fifth and sixth clock periods are still the 3-bit data 011, during the sixth clock period the triggering voltage Vcc 720 is output by the D flip-flop 716, so the state of the lock-determining signal is a high state 1. A high state 1 of the lock-determining signal indicates that a long state of the two different 3-bit data output by the digital filter 210 has been detected. This long state represents the 3-bit data 011 that occurs for a series of at least 6 clock periods. The high state 1 of the lock-determining signal is transmitted to and triggers the D flip-flop 616. At the time when the D flip-flop 616 is triggered, the 8-bit data stored by the D flip-flop 616 that represents the decoded 3-bit data 011 is output by the D flip-flop 616 to the D latch 618. The D latch 618 stores the 8-bit data, and outputs the 8-bit data for tuning the continuous-time filter when it's triggered.

If the 3-bit data during any clock period of the second to sixth clock periods is not the 3-bit data 011, but instead is the 3-bit data 010, then the least significant bit changes to be 0. Since the pervious 3-bit data is 011, the two inputs to the exclusive OR gate 702 during this clock period have different states, making the state of the reset signal 706 be 1, which resets the D flip-flops 708, 710, 712, 714, and 716. Therefore, the state of the lock-determining signal output by the D flip-flop 716 is 0, indicating that the pervious 3-bit data 011 is not a long state.

Through the operation of the lock detector 612 described above, the short state between the two different 3-bit data output by the digital filter 210 due to the residual effect is filtered out, and therefore the tuner circuit is more stable and has a higher performance.

Figure 8:
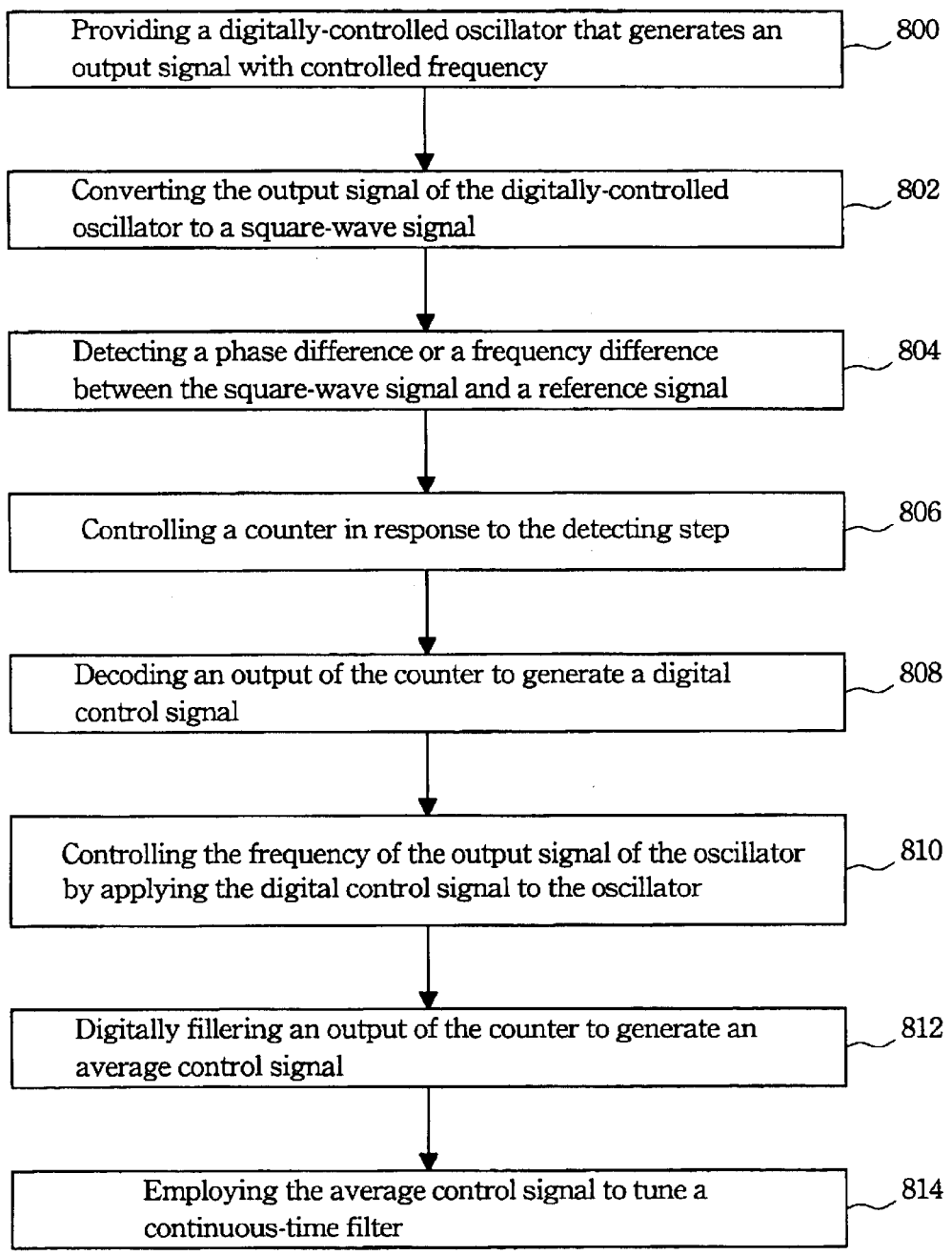
FIG. 8 is a flow chart illustrating the steps for controlling a tuner circuit.

In addition, the invention can be characterized as a method of digitally controlling a digitally controlled tuner circuit. FIG. 8 is a flow chart illustrating the steps for controlling a tuner circuit. With reference to FIG. 8, this method includes the steps described as follows. First, a digitally-controlled oscillator is provided that generates an output signal with controlled frequency (step 800 in FIG. 8). The output signal of the digitally-controlled oscillator is then converted to a square-wave signal (step 802). Next, a phase difference or a frequency difference between the square-wave signal and a reference signal is detected (step 804). A counter is then controlled in response to the detecting step (step 806). Next, an output of the counter is decoded to generate a digital control signal (step 808). The frequency of the output signal of the oscillator is then controlled by applying the digital control signal to the oscillator (step 810). An output of the counter is digitally filtered to generate an average control signal (step 812).

Finally, the average control signal is employed to tune a continuous-time filter (step 814). Besides, the step of controlling the frequency of the output signal of the oscillator can be realized by digitally varying an amount of resistance inside the oscillator.

ANALYSIS

Figure 9:
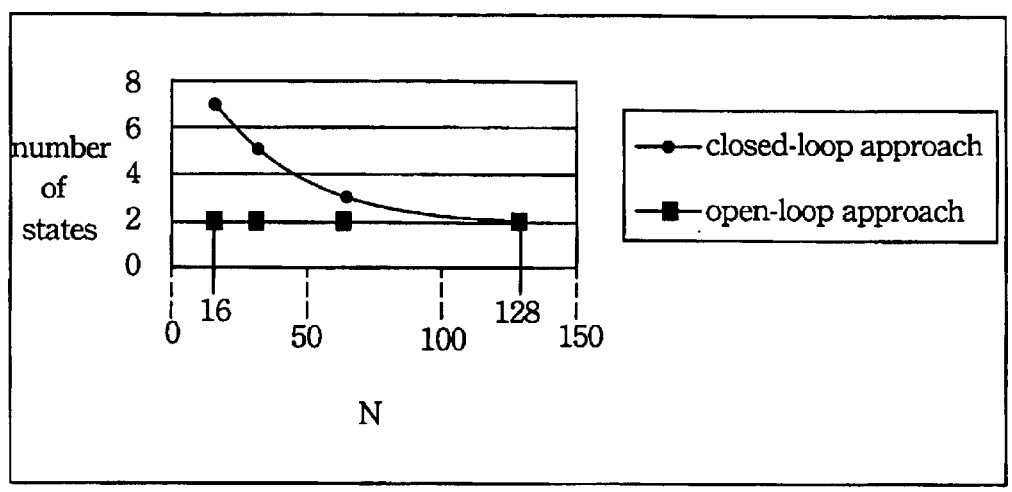
FIG. 9 illustrates the number of states output by the digital filter for different values of N under the open-loop approach and under the closed-loop approach, respectively.

According to the first embodiment, the digitally controlled tuner circuit of the invention uses an open-loop digital filter, which can be called an open-loop approach. In order to limit the occurrences of the average value data continuously output by the open-loop digital filter to only two different 3-bit data with two consecutive integer values or digital states, according to the result of the embodiment, the open-loop digital filter must continuously calculate the average of the integer values of at least 16 binary data from the up/down counter at a time; that is, N must be at least 16. In contrast, if the closed-loop filter is used, which can be called a closed-loop approach, for the same requirement of only two states the closed-loop filter must continuously calculate the average of the integer values of at least 128 binary data; that is, N must be at least 128. Therefore, using the open-loop approach greatly reduces the required amount of data stored and processed by the digital filter at a time, and thereby the cost of the tuner circuit is reduced. FIG. 9 illustrates the number of states output by the digital filter for different values of N under the open-loop approach and under the closed-loop approach, respectively.

In conclusion, the invention has the following advantages. First, the required number of data stored and processed by the digital filter at one time is relatively small due to using the open-loop approach. Second, the problem of device variations in a continuous-time filter due to the process and temperature variations is overcome by the tuning function of the PLL-based tuner circuit, so the bandwidth and cutoff frequencies of the continuous-time filter are stabilized. Third, since the digitally controlled tuner circuit of the invention doesn't incorporate a closed-loop digital filter, there is no problem of the RC time constant being very large. The RC time constant of the open-loop digital filter in the tuner circuit of the invention is not large and thereby the open-loop digital filter (also the tuner circuit) doesn't occupy a huge amount of hardware. Fourth, the tuner circuit of the invention is completely digital, so it has low harmonic distortion and low noise.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digitally-controlled tuner circuit for tuning a continuous-time filter, said digitally-controlled tuner circuit comprising:
   a digitally-controlled oscillator receiving a digital control signal, said digitally-controlled oscillator producing an output periodic signal in response to said digital control signal, wherein said digital control signal is composed of a plurality of bits;
   a square-wave generator coupled to said digitally-controlled oscillator, said square-wave generator receiving said output periodic signal and then converting said output periodic signal into a square wave output periodic signal;
   a phase/frequency detector coupled to said square-wave generator, said phase/frequency detector receiving a reference signal and said square wave output periodic signal, said phase/frequency detector generating an "up" signal and a "down" signal in response to said reference signal and said square wave output periodic signal;
   an up/down counter coupled to said phase/frequency detector, said up/down counter producing binary data in response to said "up" signal and said "down" signal;
   a first decoder coupled to said up/down counter and said digitally-controlled oscillator, said first decoder receiving said binary data and producing said digital control signal in response to said binary data; and
   a digital filter coupled to said up/down counter, said digital filter receiving said binary data to produce and outputting a first control signal, wherein said first control signal is for tuning the continuous-time filter.

2. The tuner circuit of claim 1, further comprising:
   a lock detector coupled to said digital filter, said lock detector receiving said first control signal and producing a lock-determining signal in response to said first control signal;
   a second decoder coupled to said digital filter, said second decoder receiving said first control signal and producing a second control signal in response to said first control signal;
   a first D flip-flop coupled to said second decoder and said lock detector, said first D flip-flop receiving said second control signal and said lock-determining signal, and producing a third control signal in response to said second control signal and said lock-determining signal, wherein said third control signal is for tuning the continuous-time filter.

3. The tuner circuit of claim 1, wherein said digitally-controlled oscillator is of the transconductance-capacitor type.

4. The tuner circuit of claim 1, wherein said digitally-controlled oscillator comprises:
   an electric circuit, said electric circuit being of active RC type and comprising a resistive element; and
   a plurality of digitally-controlled switch units, each of said plurality of switch units being in parallel with said resistive element;
   wherein each said switch unit has an input terminal to receive one of said plurality of bits of said digital control signal, and when each said switch unit is turned on an equivalent resistance thereof is in parallel with said resistive element.

5. The tuner circuit of claim 4, wherein each said switch unit comprises a pair of transistors connected in series, and the gates of said pair of transistors are connected to form said input terminal used to receive one of said plurality of bits of said digital control signal.

6. The tuner circuit of claim 5, wherein said pair of transistors is a pair of PMOSFETs or a pair of NMOSFETs.

7. The tuner circuit of claim 6, wherein when each said switch unit is turned on both of said pair of transistors of each said switch unit are in a deep triode region of operation, so that each of said pair of transistors of each said switch unit behaves essentially as a resistor.

8. The tuner circuit of claim 7, wherein said equivalent resistance of each said switch unit comprises a sum of resistances of said pair of transistors of each said switch unit, and the resistance of each of said pair of transistors is controllable by a ratio of the channel width to the channel length of each of said pair of transistors.

9. The tuner circuit of claim 2, wherein said lock detector comprises:
   an exclusive OR gate, said exclusive OR gate having a first input terminal to receive a least significant bit of said first control signal produced by said digital filter, a second input terminal and an output terminal;
   a second D flip-flop, said second D flip-flop having a third input terminal to receive said least significant bit, a fourth input terminal to receive a clock signal, and an output terminal coupled to said second input terminal of said exclusive OR gate; and
   a plurality of D flip-flops comprising number 1 to number M D flip-flop, each of said plurality of D flip-flops having a fifth input terminal to receive a reset signal produced at said output terminal of said exclusive OR gate, and a sixth input terminal to receive said clock signal, wherein said number 1 D flip-flop has an input terminal to receive a triggering voltage, a number m D flip-flop has an input terminal coupled to an output terminal of the number m−1 D flip-flop, M is a positive integer and m is from 2 to M, and wherein the number M D flip-flop produces and outputs said lock-determining signal of claim 2.

10. The tuner circuit of claim 9, wherein if a digital state of said least significant bit received by said exclusive OR gate remains the same in M+1 clock periods of said clock signal, during the number M+1 clock period said triggering voltage becomes an output of said number M D flip-flop, and is a voltage of said lock-determining signal.

11. A method of digitally controlling a tuner circuit, the method comprising:
   providing a digitally-controlled oscillator to generate an output signal with controlled frequency;
   converting the output signal of the digitally-controlled oscillator to a square-wave signal;
   detecting a phase difference or a frequency difference between the square-wave signal and a reference signal;
   controlling a counter in response to the detecting step;
   decoding an output of the counter to generate a digital control signal;
   controlling the frequency of the output signal of the oscillator by applying the digital control signal to the oscillator; and
   digitally filtering an output of the counter to generate an average control signal.

12. The method of claim 11, further comprising a step of tuning a continuous-time filter using the average control signal.

13. The method of claim 11, wherein the step of controlling the frequency of the output signal of the oscillator comprises digitally varying an amount of resistance inside the oscillator.

* * * * *